(12) United States Patent
Yatsuya et al.

(10) Patent No.: US 11,692,699 B2
(45) Date of Patent: Jul. 4, 2023

(54) WAVELENGTH CONVERSION MEMBER, LIGHT SOURCE DEVICE, AND METHOD FOR MANUFACTURING WAVELENGTH CONVERSION MEMBER

(71) Applicant: NGK SPARK PLUG CO., LTD., Nagoya (JP)

(72) Inventors: Yosuke Yatsuya, Nagoya (JP); Ryuichi Arakawa, Nagoya (JP); Toshiyuki Sakurai, Nagoya (JP); Tomoo Tanaka, Nagoya (JP)

(73) Assignee: NGK SPARK PLUG CO., LTD., Nagoya (JP)

( * ) Notice: Subject to any disclaimer, the term of this patent is extended or adjusted under 35 U.S.C. 154(b) by 49 days.

(21) Appl. No.: 17/624,081

(22) PCT Filed: Jul. 9, 2020

(86) PCT No.: PCT/JP2020/026822
§ 371 (c)(1),
(2) Date: Dec. 30, 2021

(87) PCT Pub. No.: WO2021/010272
PCT Pub. Date: Jan. 21, 2021

(65) Prior Publication Data
US 2022/0357027 A1 Nov. 10, 2022

(30) Foreign Application Priority Data

Jul. 16, 2019 (JP) .................................. 2019-131117

(51) Int. Cl.
*F21V 29/503* (2015.01)
*F21V 9/32* (2018.01)

(52) U.S. Cl.
CPC .............. *F21V 29/503* (2015.01); *F21V 9/32* (2018.02)

(58) Field of Classification Search
CPC ...... F21V 29/503; F21V 29/502; F21V 29/70; F21V 9/32; F21V 9/30; G03B 21/16;
(Continued)

(56) References Cited

U.S. PATENT DOCUMENTS 9,562,667 B2  2/2017  Kawamata et al.
9,909,750 B2  3/2018  Kawamata et al.
(Continued)

FOREIGN PATENT DOCUMENTS

CN    114096782 A  *  2/2022  ............. B23K 3/085
JP    2014-194895 A    10/2014
(Continued)

OTHER PUBLICATIONS

Machine translation of CN-114096782-A, 2022 (Year: 2022).*

*Primary Examiner* — Anne M Hines
*Assistant Examiner* — Jose M Diaz
(74) *Attorney, Agent, or Firm* — Stites & Harbison, PLLC; Jeffrey A. Haeberlin

(57) ABSTRACT

A wavelength conversion member includes a ceramic fluorescent body for converting a wavelength of incident light, a heat radiation member for radiating heat of the ceramic fluorescent body to an outside atmosphere, and a solder layer for joining together the ceramic fluorescent body and the heat radiation member. The solder layer includes a joining portion disposed between the ceramic fluorescent body and the heat radiation member and a protruding portion protruding outward from an outer circumferential portion of the ceramic fluorescent body. The protruding portion is spaced apart from a side surface formed on the outer circumferential portion of the ceramic fluorescent body. In the solder layer, the maximum value of thickness of the protruding portion is greater than the average value of thickness of the joining portion.

19 Claims, 9 Drawing Sheets

(58) Field of Classification Search
CPC ... G03B 21/204; H01L 33/502; H01L 33/505; H01L 33/644; H01L 33/507; G02B 5/206; G02B 5/20; F21Y 2115/10; H01S 5/0225
See application file for complete search history.

(56) References Cited

U.S. PATENT DOCUMENTS

| | | |
|---|---|---|
| 10,571,107 B2 | 2/2020 | Kitamura et al. |
| 2013/0107573 A1 | 5/2013 | Kadomi et al. |
| 2015/0316233 A1 | 11/2015 | Kawamata et al. |
| 2016/0040857 A1 | 2/2016 | Inoue et al. |
| 2017/0102135 A1 | 4/2017 | Kawamata et al. |
| 2018/0051871 A1 | 2/2018 | Kitamura et al. |

FOREIGN PATENT DOCUMENTS

| | | |
|---|---|---|
| JP | WO2014/065051 A1 | 9/2016 |
| JP | 6020631 B2 | 11/2016 |
| JP | 2017-194706 A | 10/2017 |
| WO | 2012/026206 A1 | 3/2012 |
| WO | 2014/065051 A1 | 5/2014 |

* cited by examiner

[Fig.1]
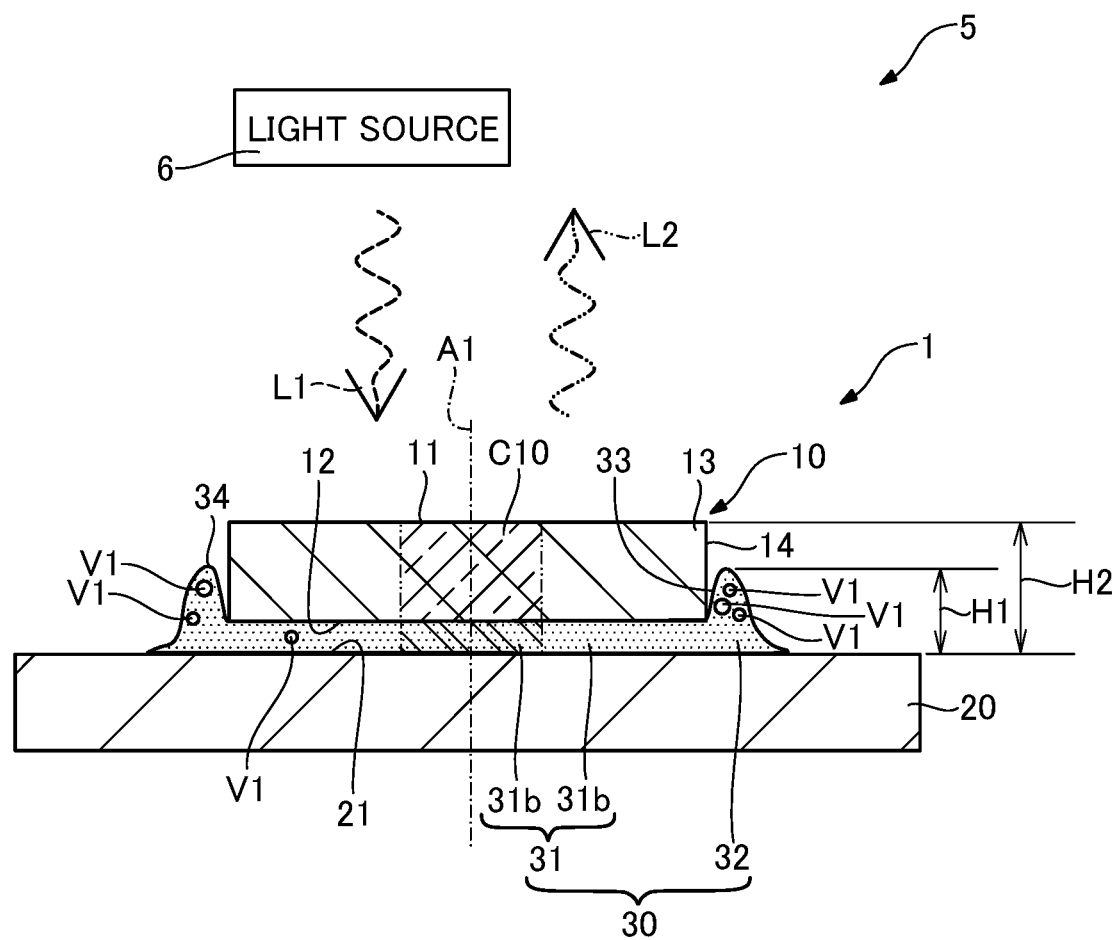

[Fig.2]
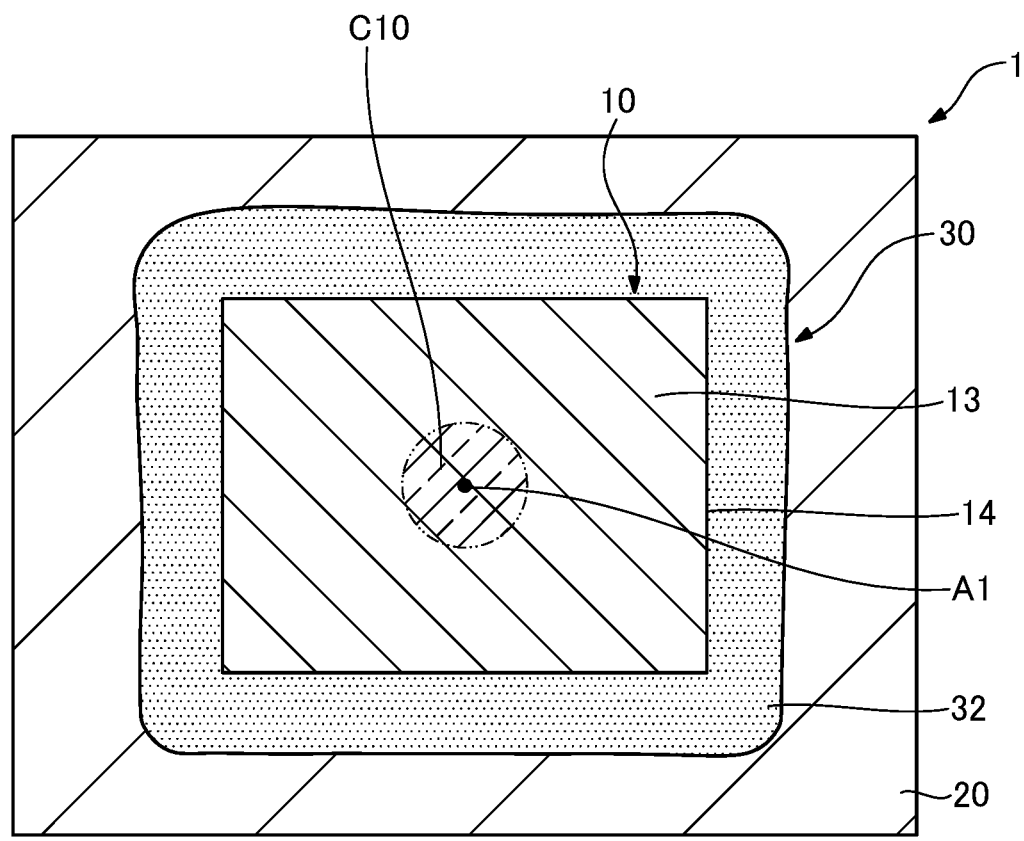

[Fig.3]
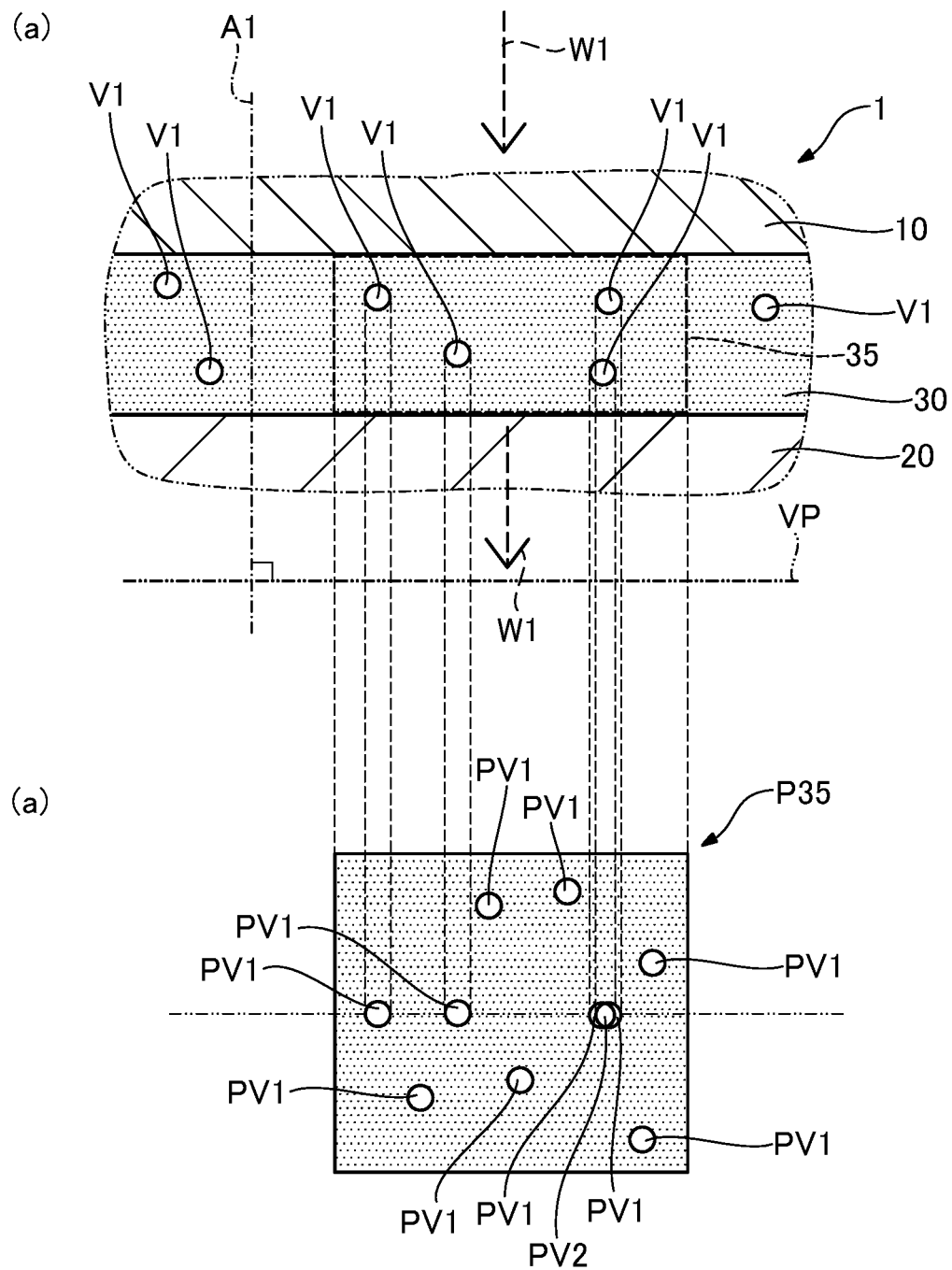

[Fig.4]
(a)
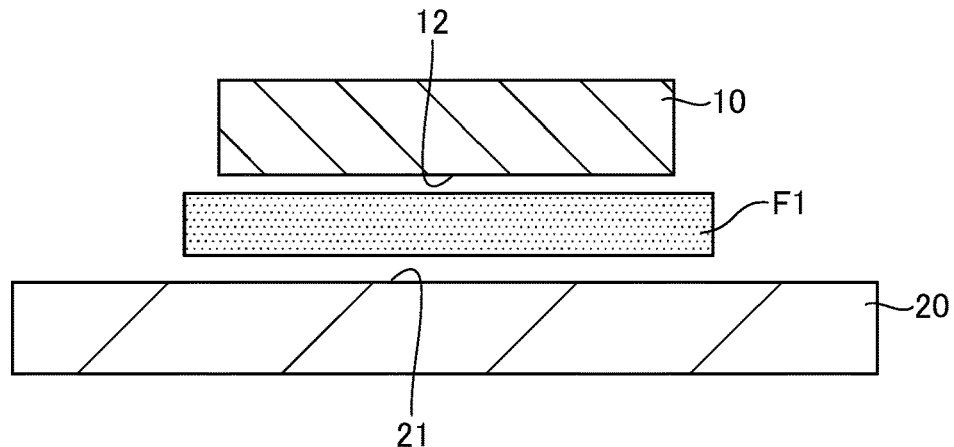
(b)
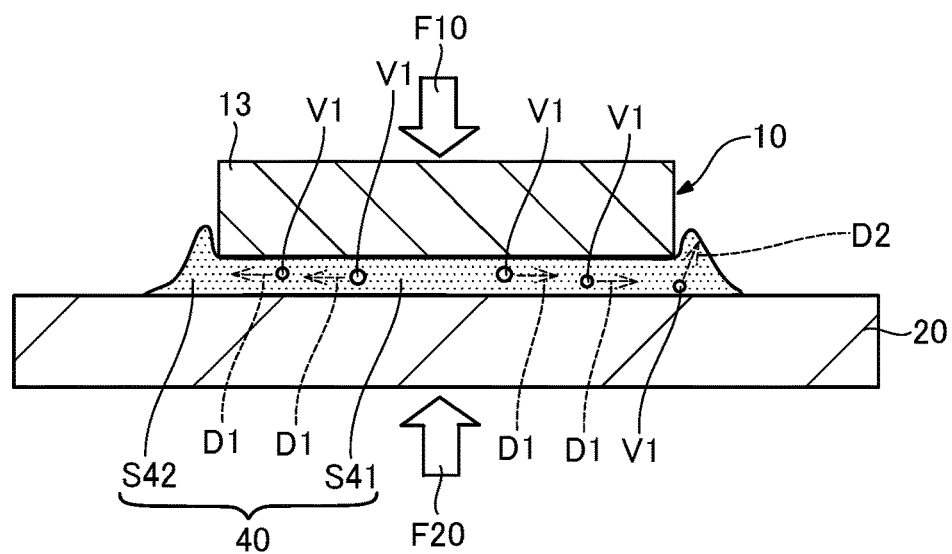
(c)
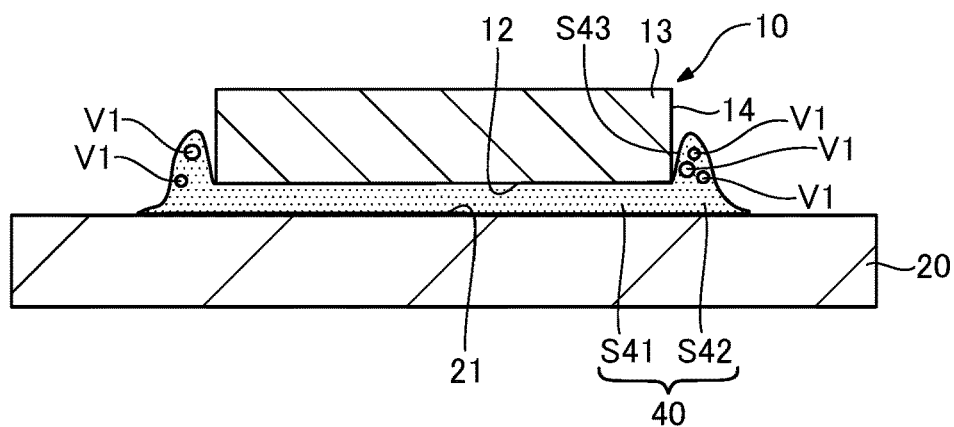

[Fig.5]
(a)
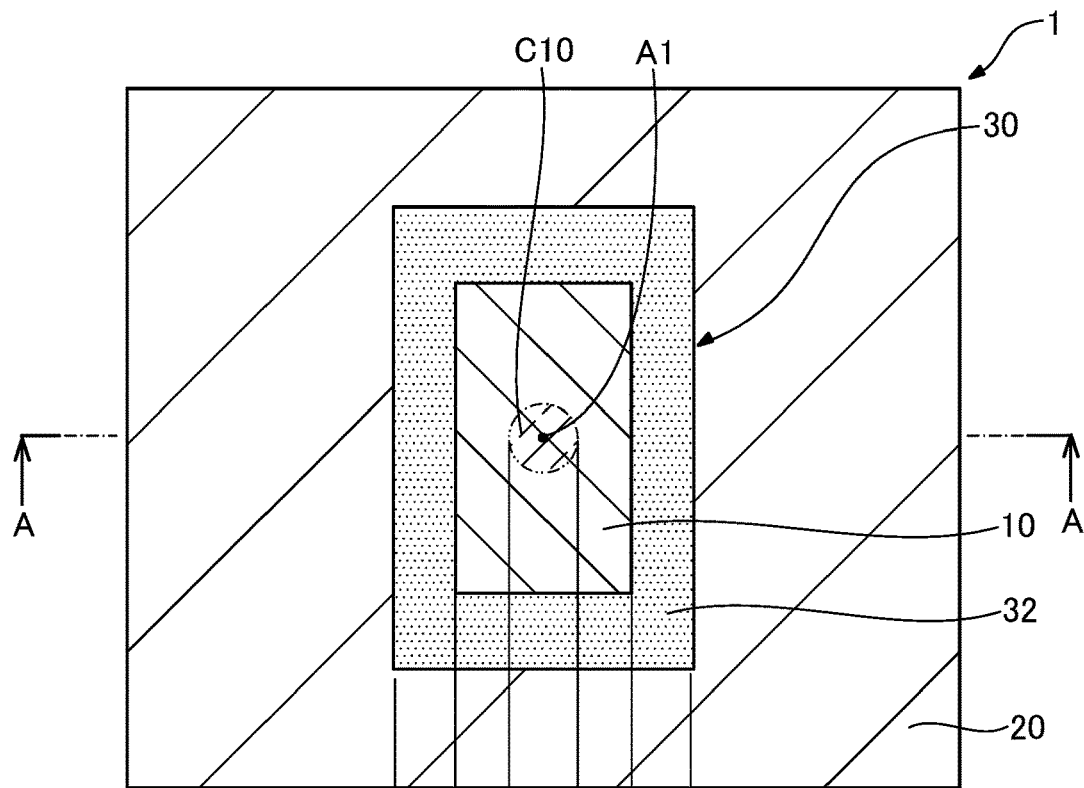
(b)
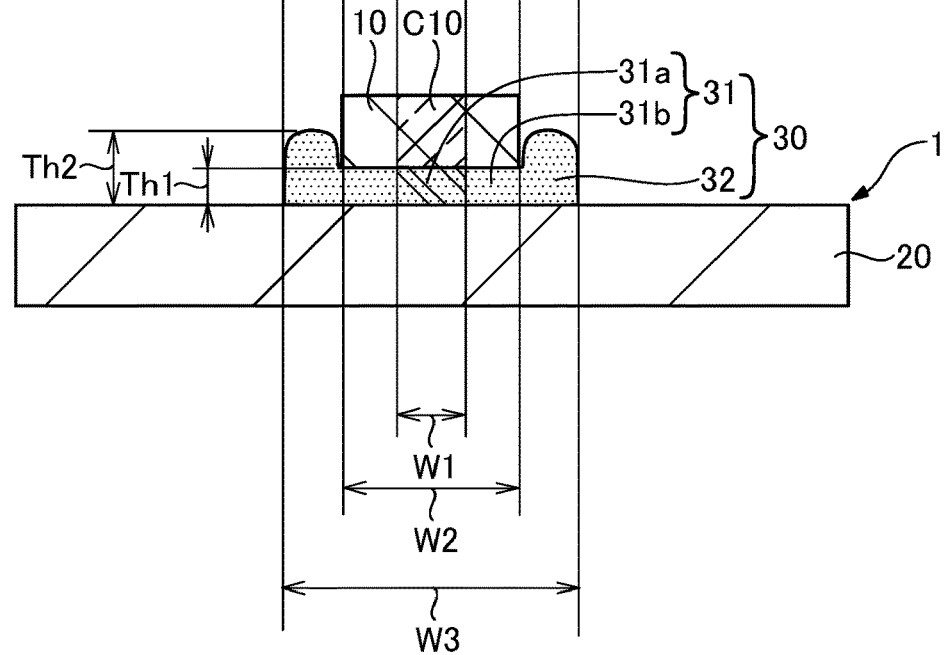

[Fig.6]
(a)
| VOID FRACTION OF JOINING PORTION(%) | 3.4 |
|---|---|
| VOID FRACTION OF CENTRAL PORTION(%) | 2.8 |
| VOID FRACTION OF PROTRUDING PORTION(%) | 4.3 |
(b)
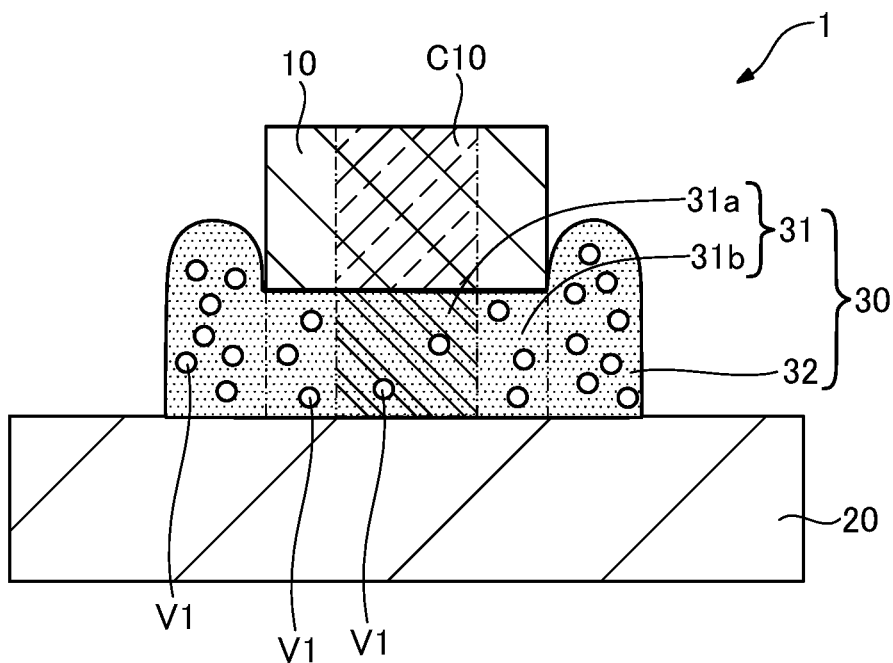

[Fig.7]
(a)
| THICKNESS OF JOINING PORTION($\mu$m) | 10 | 10 | 10 | 10 | 10 | 10 |
|---|---|---|---|---|---|---|
| THICKNESS OF PROTRUDING PORTION($\mu$m) | 10 | 12 | 15 | 20 | 53 | 100 |
| $\dfrac{\text{THICKNESS OF JOINING PORTION}}{\text{THICKNESS OF PROTRUDING PORTION}}$ (—) | 1 | 1.2 | 1.5 | 2 | 5.3 | 10 |
| VOID FRACTION OF JOINING PORTION(%) | 5.3 | 5.1 | 4.9 | 2.3 | 2.1 | 1.8 |
(b)
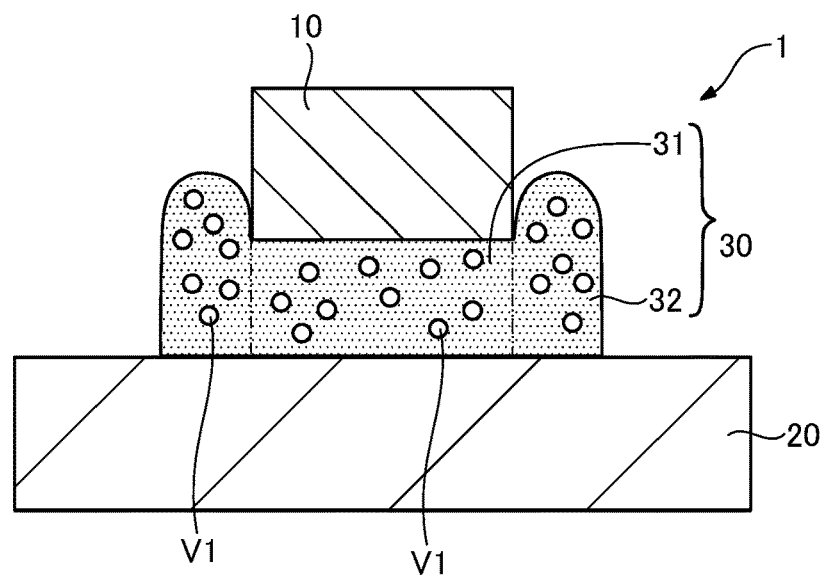
(c)
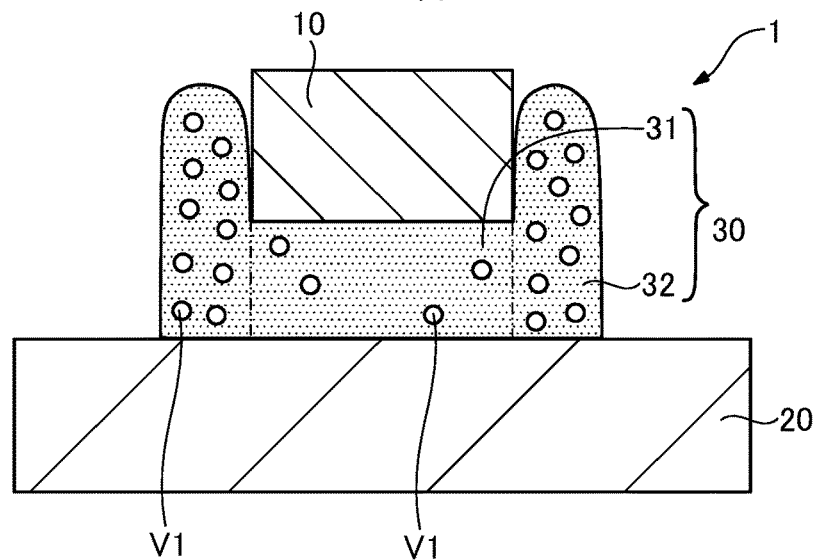

[Fig.8]
(a)
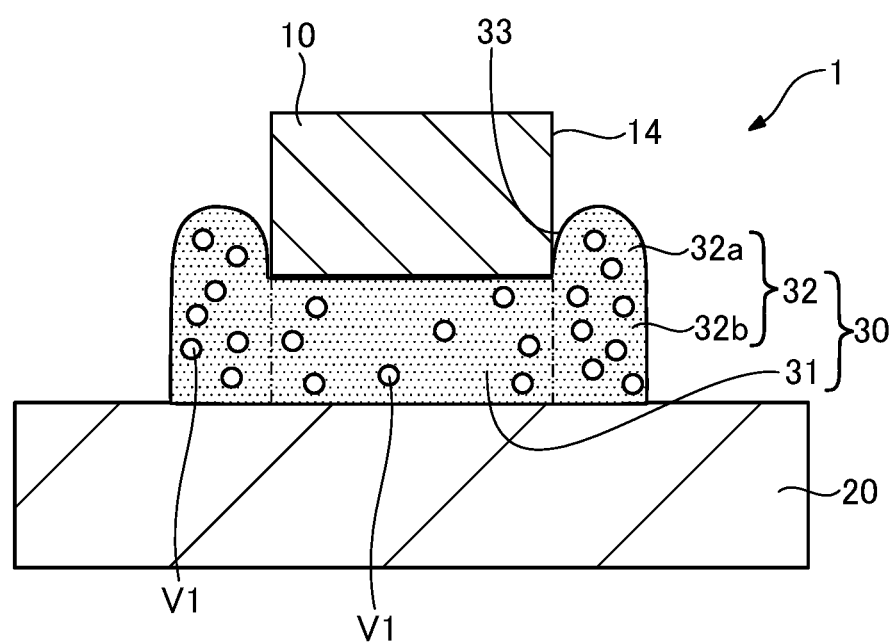
(b)
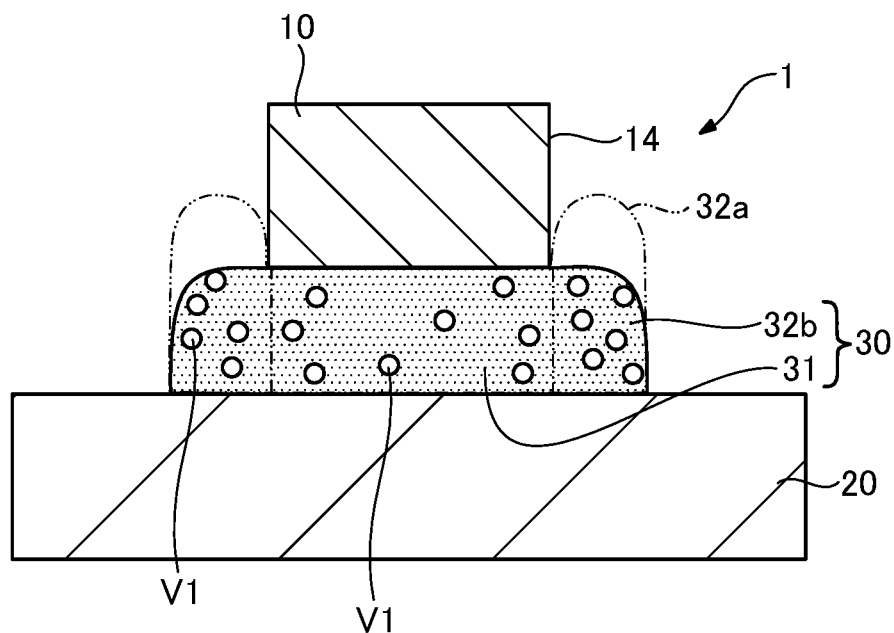

[Fig.9]
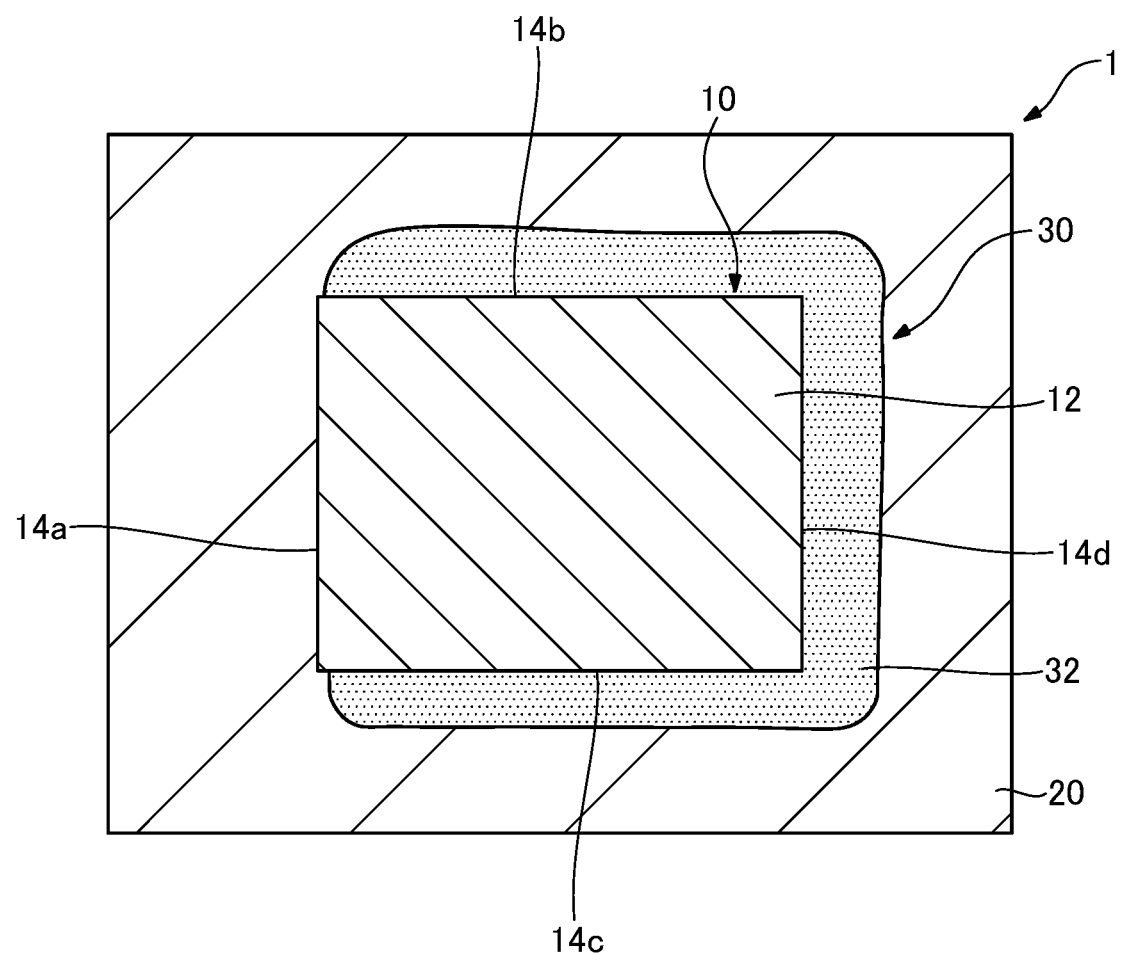

WAVELENGTH CONVERSION MEMBER, LIGHT SOURCE DEVICE, AND METHOD FOR MANUFACTURING WAVELENGTH CONVERSION MEMBER

TECHNICAL FIELD

The present invention relates to a wavelength conversion member, to a light source device, and to a method for manufacturing a wavelength conversion member.

BACKGROUND ART

Heretofore, a wavelength conversion member for converting the wavelength of light emitted from a light source has been known. In general, the wavelength conversion member is composed of a fluorescent body for converting the wavelength of incident light, a heat radiation member, and a solder layer for joining together the fluorescent body and the heat radiation member. Heat of the fluorescent body is radiated by the heat radiation member. Voids contained in solder lower thermal conductivity between the fluorescent body and the heat radiation member. For example, Patent Document 1 discloses a technique of reducing the sizes of voids contained in the solder layer to a prescribed value or smaller. Also, Patent Document 2 discloses a technique of forming a solder layer on a surface of the fluorescent body on the side toward the heat radiation member and on side surfaces of the fluorescent body, thereby increasing the contact area between the fluorescent body and the solder layer.

PRIOR ART DOCUMENTS

Patent Documents

[Patent Document 1] Japanese Patent No. 6020631
[Patent Document 2] Japanese Patent Application Laid-Open (kokai) No. 2017-194706

SUMMARY OF THE INVENTION

Problem to be Solved by the Invention

However, even in the case where the fluorescent body and the heat radiation member are joined together by the technique disclosed in Patent Document 1, voids remain between the fluorescent body and the heat radiation member, and therefore, further improvement of thermal conductivity of the solder layer has not been easy. Also, in the case where the fluorescent body and the heat radiation member are joined together by the technique disclosed in Patent Document 2, when the temperature of the wavelength conversion member falls after the fluorescent body and the heat radiation member have been joined together, due to the difference in thermal shrinkage between the solder layer and the fluorescent body, the fluorescent body is restrained by the solder layer formed on the side surfaces of the fluorescent body. Therefore, there has been a possibility that the fluorescent body breaks due to shrinkage of the solder layer. As described above, it has not been easy to prevent breakage of the fluorescent body while improving the thermal conductivity between the fluorescent body and the heat radiation member.

The present invention has been accomplished so as to solve the above-described problem, and an object of the present invention is to provide a technique for simultaneously achieving improvement of thermal conductivity between a ceramic fluorescent body and a heat radiation member in a wavelength conversion member and prevention of breakage of the ceramic fluorescent body.

Means for Solving the Problem

The present invention has been accomplished so as to solve at least part of the above-described problem and can be realized in the following aspects.

(1) According to one aspect of the present invention, a wavelength conversion member is provided. This wavelength conversion member includes: a ceramic fluorescent body for converting a wavelength of incident light; a heat radiation member for radiating heat of the ceramic fluorescent body to an outside atmosphere; and a solder layer for joining together the ceramic fluorescent body and the heat radiation member, wherein the solder layer includes a joining portion disposed between the ceramic fluorescent body and the heat radiation member and a protruding portion protruding outward from an outer circumferential portion of the ceramic fluorescent body, the protruding portion is spaced apart from a side surface formed on the outer circumferential portion of the ceramic fluorescent body, and, in the solder layer, a maximum value of thickness of the protruding portion is greater than an average value of thickness of the joining portion.

According to this configuration, in the solder layer, the maximum value of the protruding portion is greater than the average value of the thickness of the joining portion. When the ceramic fluorescent body and the heat radiation member are joined together, the protruding portion is formed as a result of the solder between the ceramic fluorescent body and the heat radiation member being pushed out toward the outside of the outer circumferential portion of the ceramic fluorescent body. At that time, voids present in the solder between the ceramic fluorescent body and the heat radiation member move from a region between the ceramic fluorescent body and the heat radiation member together with the pushed out solder, and move upward in the solder on the outer side of the outer circumferential portion of the ceramic fluorescent body. As a result, the number of the voids of the joining portion decreases as compared with the case where the voids do not move. Therefore, the heat conduction between the ceramic fluorescent body and the heat radiation member becomes less likely to be hindered by the voids. Accordingly, the thermal conductivity between the ceramic fluorescent body and the heat radiation member can be improved. Also, the protruding portion is spaced apart from the side surface of the ceramic fluorescent body. Therefore, even in the case where the solder layer shrinks when the temperature falls after the ceramic fluorescent body and the heat radiation member have been joined together, the protruding portion does not restrain the ceramic fluorescent body. As a result, it is possible to prevent breakage of the ceramic fluorescent body due to shrinkage of the solder layer. As described above, it is possible to simultaneously achieve improvement of the thermal conductivity between the ceramic fluorescent body and the heat radiation member and prevention of breakage of the ceramic fluorescent body. Also, since the thermal conductivity between the ceramic fluorescent body and the heat radiation member is improved, the durability of the ceramic fluorescent body is improved, and a decrease in light emission efficiency can be suppressed.

(2) According to another aspect of the present invention, another wavelength conversion member is provided. This wavelength conversion member includes: a ceramic fluorescent body for converting a wavelength of incident light; a heat radiation member for radiating heat of the ceramic fluorescent body to an outside atmosphere; and a solder layer for joining together the ceramic fluorescent body and the heat radiation member, wherein the solder layer includes a joining portion disposed between the ceramic fluorescent body and the heat radiation member and a protruding portion protruding outward from an outer circumferential portion of the ceramic fluorescent body, and a void fraction of the joining portion is lower than a void fraction of the protruding portion.

According to this configuration, the void fraction of the joining portion is lower than the void fraction of the protruding portion. The void fraction refers to an area ratio between a portion of the solder layer and voids contained in that portion of the solder layer. Specifically, a portion of the solder layer and the voids contained in that portion of the solder layer are projected on a virtual plane perpendicular to a center axis of the wavelength conversion member, and the ratio of the area of projection views of the voids to the area of a projection view of that portion of the solder layer on the virtual plane is calculated as the void fraction. Therefore, the heat conduction between the ceramic fluorescent body and the heat radiation member by the joining portion is less likely to be hindered by the voids. Accordingly, the thermal conductivity between the ceramic fluorescent body and the heat radiation member can be improved.

(3) According to still another aspect of the present invention, still another wavelength conversion member is provided. This wavelength conversion member includes: a ceramic fluorescent body for converting a wavelength of incident light; a heat radiation member for radiating heat of the ceramic fluorescent body to an outside atmosphere; and a solder layer for joining together the ceramic fluorescent body and the heat radiation member, wherein the solder layer includes a joining portion disposed between the ceramic fluorescent body and the heat radiation member and a protruding portion protruding outward from an outer circumferential portion of the ceramic fluorescent body, and, in the joining portion, a void fraction of a central portion through which a center axis of the wavelength conversion member extends is lower than a void fraction of a remaining portion of the joining portion remaining after exclusion of the central portion.

According to this configuration, the central portion of the joining portion is located between the heat radiation member and the central portion of the ceramic fluorescent body, which portion generates a large amount of heat because of easy irradiation with light. Also, the void fraction of the central portion of the joining portion is lower than the void fraction of the remaining portion of the joining portion which remains after exclusion of the central portion therefrom. Since the central portion of the joining portion is higher in thermal conductivity than the remaining portion of the joining portion, the heat generated in the central portion of the ceramic fluorescent body as a result of irradiation with light can be quickly transferred to the heat radiation member. Accordingly, the thermal conductivity between the ceramic fluorescent body and the heat radiation member can be improved by rendering the void fraction of the central portion lower than the void fraction of the remaining portion of the joining portion.

(4) In the wavelength conversion member according to any of the above-described aspects, the protruding portion may be formed to surround the entire circumference of the outer circumferential portion of the ceramic fluorescent body. According to this configuration, when the ceramic fluorescent body and the heat radiation member are joined together, the solder between the ceramic fluorescent body and the heat radiation member protrudes along the entire circumference of the outer circumferential portion of the ceramic fluorescent body. Therefore, the distance over which the voids between the ceramic fluorescent body and the heat radiation member move to the outside of the outer circumferential portion of the ceramic fluorescent body becomes shorter as compared with the case where the protruding portion is formed to surround a portion of the outer circumferential portion of the ceramic fluorescent body, and thus, the number of the voids of the joining portion decreases further. Accordingly, the thermal conductivity between the ceramic fluorescent body and the heat radiation member can be further improved.

(5) In the wavelength conversion member according to any of the above-described aspects, a maximum value of thickness of the protruding portion may be not less than two times an average value of thickness of the joining portion and not greater than ten times the average value. According to this configuration, it becomes easier for voids moving from a region between the ceramic fluorescent body and the heat radiation member to the outside of the outer circumferential portion of the ceramic fluorescent body to move upward in the solder layer on the outer side of the outer circumferential portion of the ceramic fluorescent body. Therefore, it becomes easier for the voids between the ceramic fluorescent body and the heat radiation member to move to the outside of the outer circumferential portion of the ceramic fluorescent body, and thus, the number of the voids of the joining portion decreases further. Accordingly, the thermal conductivity between the ceramic fluorescent body and the heat radiation member can be further improved.

(6) In the wavelength conversion member according to any of the above-described aspects, a height of the protruding portion from the heat radiation member may be less than a height of a light incident surface of the ceramic fluorescent body from the heat radiation member. This configuration makes it possible to prevent hindrance of light emission from the ceramic fluorescent body by the protruding portion, whose maximum thickness is greater than the average thickness of the joining portion.

(7) According to still another aspect of the present invention, a light source device is provided. This light source device includes the above-described wavelength conversion member and a light source for applying light to the ceramic fluorescent body. According to this configuration, the light source device emits to the outside light whose wavelength differs from the wavelength of light which is applied to the ceramic fluorescent body by the light source. In the wavelength conversion member having the ceramic fluorescent body for converting the wavelength of the light, since the number of the voids contained in the joining portion of the solder layer between the ceramic fluorescent body and the heat radiation member is relatively small, the heat conduction in the joining portion between the ceramic fluorescent body and the heat radiation member is less likely to be hindered by the voids. Therefore, a decrease in the light emission intensity of the light source device due to temperature quenching can be suppressed. Also, since the protruding portion is spaced apart from the side surface of the ceramic fluorescent body, it is possible to prevent the ceramic fluorescent body from being broken due to shrinkage of the solder layer. Therefore, it is possible to prevent a decrease in the light emission intensity of the light source device due to breakage of the ceramic fluorescent body.

(8) According still another aspect of the present invention, a method for manufacturing a wavelength conversion member is provided. This wavelength conversion member manufacturing method includes: a preparing step of preparing a ceramic fluorescent body for converting a wavelength of incident light and a heat radiation member which is to be joined to the ceramic fluorescent body; a joining step of joining together the ceramic fluorescent body and the heat radiation member by a solder layer; and a machining step of machining the solder layer after the joining step, wherein, in the joining step, the solder layer forms a joining portion disposed between the ceramic fluorescent body and the heat radiation member, and a protruding portion protruding outward from an outer circumferential portion of the ceramic fluorescent body and formed such that a maximum value of thickness of the protruding portion is greater than an average value of thickness of the joining portion, and, in the machining step, at least part of the protruding portion, which part includes a portion spaced apart from a side surface formed on the outer circumferential portion of the ceramic fluorescent body, is removed.

According to this configuration, in the joining step, voids present in the solder between the ceramic fluorescent body and the heat radiation member move from the region between the ceramic fluorescent body and the heat radiation member together with the solder and move upward in the solder on the outer side of the outer circumferential portion of the ceramic fluorescent body. As a result, the number of the voids of the joining portion decreases as compared with the case where the voids do not move, and therefore, the thermal conductivity between the ceramic fluorescent body and the heat radiation member can be improved. Subsequently, in the machining step, machining for removing at least part of the protruding portion, which part includes a portion spaced apart from the side surface of the ceramic fluorescent body is performed, whereby breakage of the ceramic fluorescent body due to shrinkage of the solder layer can be prevented. As described above, it is possible to simultaneously achieve improvement of the thermal conductivity between the ceramic fluorescent body and the heat radiation member and prevention of breakage of the ceramic fluorescent body.

Notably, the present invention can be realized in various forms. For example, the present invention can be realized in the form of, for example, a light emission system using the wavelength conversion member or the light source device, a method for manufacturing the light source device or the light emission system, a computer program for causing a computer to execute manufacture of the wavelength conversion member or the light source device, a server apparatus which distributes the computer program, or a non-temporary storage medium storing the computer program.

BRIEF DESCRIPTION OF THE DRAWINGS

FIG. 1 Schematic view of a light source device of a first embodiment.

FIG. 2 Top view of a wavelength conversion member.

FIG. 3 Views used for describing a method for calculating the void fraction of a solder layer.

FIG. 4 Views used for describing a method for manufacturing the wavelength conversion member.

FIG. 5 Views used for describing the details of a first evaluation test for the wavelength conversion member.

FIG. 6 Table and view used for describing the results of the first evaluation test for the wavelength conversion member.

FIG. 7 Table and views used for describing the results of a second evaluation test for the wavelength conversion member.

FIG. 8 Sectional views of a modification of the wavelength conversion member of the first embodiment.

FIG. 9 Top view of another modification of the wavelength conversion member of the first embodiment.

MODE FOR CARRYING OUT THE INVENTION

First Embodiment

FIG. 1 is a schematic view of a light source device 5 of a first embodiment. FIG. 2 is a top view of a wavelength conversion member 1. The light source device 5 of the present embodiment includes the wavelength conversion member 1 and a light source 6. When the wavelength conversion member 1 is irradiated with light L1 emitted from the light source 6, such as an externally provided light emitting diode (LED) or semiconductor laser (laser diode (LD)), the wavelength conversion member 1 emits light L2 having a wavelength different from that of the light L1. This wavelength conversion member 1 is used in various types of optical apparatuses such as headlights, lighting equipment, and projectors. The wavelength conversion member 1 includes a ceramic fluorescent body 10, a heat radiation member 20, and a solder layer 30. Notably, in FIG. 1, for convenience of description, the ceramic fluorescent body 10, the heat radiation member 20, and the solder layer 30 are illustrated in such a manner that the relation among their thicknesses differs from the actual relation among their thicknesses.

The ceramic fluorescent body 10 is composed of a ceramic sintered body and converts the wavelength of light entering from an incident surface 11. The ceramic sintered body has a fluorescent phase mainly composed of fluorescent crystal grains and a translucent phase mainly composed of translucent crystal grains. Preferably, the crystal grains of the translucent phase have a composition represented by a chemical formula $Al_2O_3$, and the crystal grains of the fluorescent phase have a composition represented by a chemical formula $A_3B_5O_{12}$:Ce (so-called a garnet structure). The formula "$A_3B_5O_{12}$:Ce" means that the element A of $A_3B_5O_{12}$ is partially substituted by Ce through formation of a solid solution.

The element A in the chemical formula $A_3B_5O_{12}$:Ce is at least one element selected from the following element group:

Sc, Y, and lanthanoids (except for Ce) (however, Gd may be further included in the element A).

The element B in the chemical formula $A_3B_5O_{12}$:Ce is at least one element selected from the following element group:

Al (however, Ga may be further included in the element B).

Since a ceramic sintered body is used as the ceramic fluorescent body 10, light scatters at the interface between the fluorescent phase and the translucent phase, whereby the angle dependency of light color can be mitigated. As a result, the uniformity of color can be improved. Notably, the material of the ceramic fluorescent body 10 is not limited to the above-described material.

An unillustrated metal film is disposed on a main surface 12 of the ceramic fluorescent body 10 on a side toward the heat radiation member 20. Since this metal film has good solder wettability, the metal film enhances the adhesion between the ceramic fluorescent body 10 and the solder layer 30. Also, the metal film reflects light passing through the ceramic fluorescent body 10 and light generated in the ceramic fluorescent body 10, thereby improving the light emission efficiency of the wavelength conversion member 1.

The heat radiation member 20 is a rectangular plate member formed of a material whose thermal conductivity is higher than that of the ceramic fluorescent body 10, for example, copper, copper-molybdenum alloy, copper-tungsten alloy, aluminum, aluminum nitride, or the like. An unillustrated a joint film is disposed on a main surface 21 of the heat radiation member 20 on a side toward the ceramic fluorescent body 10. Since this joint film has good solder wettability, the joint film enhances the adhesion between the heat radiation member 20 and the solder layer 30. The heat radiation member 20 radiates, to an outside atmosphere, heat of the ceramic fluorescent body 10 conducted through the solder layer 30. Notably, the heat radiation member 20 may be a member having a single layer structure formed of the above-described material or may be a member having a multi layer structure in which the layers are formed of the same material or different materials.

The solder layer 30 is disposed between the ceramic fluorescent body 10 and the heat radiation member 20 and is formed of gold and tin. The solder layer 30 joins together the ceramic fluorescent body 10 and the heat radiation member 20. As shown in FIG. 1, the solder layer 30 has a joining portion 31 and a protruding portion 32. The joining portion 31 is a portion of the solder layer 30 and is disposed under the ceramic fluorescent body 10; i.e., between the ceramic fluorescent body 10 and the heat radiation member 20. The joining portion 31 is in contact with the main surface 12 of the ceramic fluorescent body 10 and the main surface 21 of the heat radiation member 20, and joins together the ceramic fluorescent body 10 and the heat radiation member 20.

The protruding portion 32 is located on the outer side of the joining portion 31. Specifically, as shown in FIG. 1, the protruding portion 32 has a shape such that, on the main surface 21 of the heat radiation member 20, the protruding portion 32 protrudes from an outer circumferential portion 13 of the ceramic fluorescent body 10 toward the outside of the ceramic fluorescent body 10 while being connected to an outer circumferential portion of the joining portion 31. In the present embodiment, as shown in FIG. 2, the protruding portion 32 is formed to surround the entire circumference of the outer circumferential portion 13 of the ceramic fluorescent body 10. As shown in FIG. 1, an inner wall 33 of the protruding portion 32 is spaced apart from a side surface 14 formed on the outer circumferential portion 13 of the ceramic fluorescent body 10. As a result, the protruding portion 32 has an apex 34 (see FIG. 1) formed at a position apart from the outer circumferential portion 13 of the ceramic fluorescent body 10. As shown in FIG. 1, the height H1, as measured from the main surface 21 of the heat radiation member 20, of the apex 34 is less than the height H2, as measured from the main surface 21 of the heat radiation member 20, of the incident surface 11 of the ceramic fluorescent body 10, which is irradiated with the light L1.

In the solder layer 30 of the present embodiment, the maximum value of the thickness of the protruding portion 32 is greater than the average value of the thickness of the joining portion 31. Specifically, the maximum value of the thickness of the protruding portion 32 is not less than two times the average value of the thickness of the joining portion 31 and not greater than ten times the average. The thickness of the joining portion 31 refers to the average value of thicknesses at 10 locations set at equal intervals on a cross section of the joining portion 31, which cross section includes a center axis A1 (see FIGS. 1 and 2) of the wavelength conversion member 1 and is perpendicular to the joint surface between the ceramic fluorescent body 10 and the solder layer 30 and the joint surface between the solder layer 30 and the heat radiation member 20.

The solder layer 30 contains voids V1 generated inside the solder layer 30 during manufacture of the wavelength conversion member 1. In the solder layer 30 of the present embodiment, the joining portion 31 has a void fraction lower than that of the protruding portion 32. Also, when a portion of the joining portion 31 located between the heat radiation member 20 and a central portion C10 of the ceramic fluorescent body 10 through which the center axis A1 of the wavelength conversion member 1 extends is defined as a central portion 31a, the void fraction of the central portion 31a is lower than that of a remaining portion 31b remaining after exclusion of the central portion 31a from the joining portion 31. The central portion 31a is a portion of the joining portion 31 through which the center axis A1 of the wavelength conversion member 1 extends. In the present embodiment, the central portion 31a refers to, for example, a circular columnar portion whose cross section perpendicular to the center axis A1 is circular and has a center on the center axis A1.

Here, a method for calculating the void fraction of the solder layer 30 in the present embodiment will be described. The void fraction in the present embodiment refers to an area ratio between a portion of the solder layer 30 and voids V1 contained in that portion of the solder layer 30. Specifically, a portion of the solder layer 30 and the voids V1 contained in that portion of the solder layer 30 are projected on a virtual plane perpendicular to the center axis A1 of the wavelength conversion member 1, and the ratio of the area of projection views of the voids V1 to the area of a projection view of that portion of the solder layer 30 on the virtual plane is calculated as the void fraction.

FIG. 3 is a pair of views used for describing a method for calculating the void fraction of the solder layer 30. Here, a description will be made by using a portion 35 of the solder layer 30 shown in section (a) of FIG. 3 which is a cross-sectional view of the wavelength conversion member 1 perpendicular to the center axis A1. The portion 35 of the solder layer 30 is located between the ceramic fluorescent body 10 and the heat radiation member 20 and is assumed to contain voids V1 in a state as shown in section (a) of FIG. 3. Notably, since section (a) of FIG. 3 is a cross-sectional view, it is assumed that voids V1 which do not appear in the cross-sectional view are also contained in the portion 35 of the solder layer 30.

When the void fraction of the solder layer 30 is calculated, a virtual plane VP perpendicular to the center axis A1 is assumed, and there is drawn a projection view of the portion 35 projected on the virtual plane VP when the portion 35 of the solder layer 30 is viewed as indicated by a broken line arrow W1 shown in section (a) of FIG. 3. The projection view is shown in section (b) of FIG. 3. Here, the projection view P35 of the portion 35 of the solder layer 30 on the virtual plane VP is assumed to be square. At that time, since the voids V1 contained in the portion 35 of the solder layer 30 are projected onto the projection view P35 as projection views PV1 of the voids V1, as shown in section (b) of FIG. 3, the projection view P35 is dotted with the projection views PV1 of the voids V1. The ratio of the total of the areas of the projection views PV1 of the voids V1 to the area of the projection view P35 is used as the void fraction in the present embodiment. Notably, as shown in section (b) of FIG. 3, when the voids V1 are projected onto the virtual plane VP, respective projection views PV1 of a plurality of voids V1 may overlap each other (for example, a projection view PV2 in section (b) of FIG. 3). In such a case, the area of portions overlapping each other is calculated as an area occupied by the projection view of a single void V1, and is not counted twice.

Next, a method for manufacturing the wavelength conversion member 1 will be described. First, in a preparing step, a metal film is formed on the main surface 12 of the ceramic fluorescent body 10 by means of vacuum deposition or sputtering. Also, a joint film is formed on the main surface 21 of the heat radiation member 20 by means of plating. Next, in a joining step, the ceramic fluorescent body 10 and the heat radiation member 20 with gold tin solder foil sandwiched therebetween are heated in a reflow furnace in a nitrogen atmosphere or a hydrogen atmosphere so as to join together the ceramic fluorescent body 10 and the heat radiation member 20. At that time, the ceramic fluorescent body 10 and the heat radiation member 20 are joined together in such a manner that the gold tin solder foil melted between the ceramic fluorescent body 10 and the heat radiation member 20 protrudes toward the outside of the ceramic fluorescent body 10. Notably, in the case where a joint film is formed on the surface of the heat radiation member 20, the joint film may be formed by means of vacuumed deposition or sputtering. Also, instead of using the gold tin solder foil, gold tin solder paste may be applied.

FIG. 4 is a set of views used for describing the method of manufacturing the wavelength conversion member 1. Section (a) of FIG. 4 shows the ceramic fluorescent body 10, the heat radiation member 20, and the gold tin solder foil F1 before being joined. As shown in section (a) of FIG. 4, the gold tin solder foil F1, which is larger than the ceramic fluorescent body 10 and smaller than the heat radiation member 20, is inserted between the metal film formed on the main surface 12 of the ceramic fluorescent body 10 and the joint film formed on the main surface 21 of the heat radiation member 20. When the ceramic fluorescent body 10 and the heat radiation member 20 with the gold tin solder foil F1 sandwiched therebetween are heated in the reflow furnace, the melted gold tin solder foil F1 reacts with the metal film of the ceramic fluorescent body 10 and the joint film of the heat radiation member 20, whereby the ceramic fluorescent body 10 and the heat radiation member 20 are joined together. At that time, voids V1 are generated (see section (b) of FIG. 4). The voids originate from a gap between the gold tin solder foil F1 and the metal film or the joint film and from gas mixed in a plating step.

When the ceramic fluorescent body 10 and the heat radiation member 20 are joined together through application of load (see outline arrows F10 and F20 shown in section (b) of FIG. 4), of a molten solder 40 produced as a result of melting of the gold tin solder foil F1, a central portion S41 located between the ceramic fluorescent body 10 and the heat radiation member 20 moves toward the outside of the outer circumferential portion 13 of the ceramic fluorescent body 10. At that time, because of a solder flow in the central portion S41, the voids V1 of the central portion S41 move to an outer portion S42 of the molten solder 40 (broken line arrows D1 in section (b) of FIG. 4). The outer portion S42 of the molten solder 40 rises up due to the flow from the central portion S41 to the outer portion S42 in the molten solder 40, and becomes thicker than the central portion S41.

Therefore, after the voids V1 move from the central portion S41 to the outer portion S42, the voids V1 move up in the outer portion S42 of the molten solder 40 (a broken line arrow D2 in section (b) of FIG. 4). In the present embodiment, the height of the outer portion S42 is adjusted by adjusting the thickness and size of the gold tin solder foil F1 when inserted between the ceramic fluorescent body 10 and the heat radiation member 20 and the load applied when the ceramic fluorescent body 10 and the heat radiation member 20 are joined together. As a result, it becomes easier for the voids V1 of the central portion S41 to move to the outer portion S42. Therefore, in the manufacturing method of the present embodiment, as shown in section (c) of FIG. 4, the voids V1 in the molten solder 40 come together in the outer portion S42, and the number of the voids V1 of the central portion S41 decreases.

In the method for manufacturing the wavelength conversion member 1 of the present embodiment, when the ceramic fluorescent body 10 and the heat radiation member 20 are joined together through application of load, the outer portion S42 of the molten solder 40 surrounds the entire circumference of the outer circumferential portion 13 of the ceramic fluorescent body 10. As a result, the distance over which the voids V1 of the central portion S41 move to the outer portion S42 becomes relatively short, and therefore, the number of the voids V1 of the central portion S41 decreases further.

The temperatures of the ceramic fluorescent body 10 and the heat radiation member 20 in a state shown in section (c) of FIG. 4 are lowered, the central portion S41 of the molten solder 40 becomes the joining portion 31 of the solder layer 30, and the outer portion S42 becomes the protruding portion 32, whereby the ceramic fluorescent body 10 and the heat radiation member 20 are joined together by the solder layer 30. At that time, as shown in section (c) of FIG. 4, the inner wall S43 of the outer portion S42 of the molten solder 40 is spaced apart from the side surface 14 of the ceramic fluorescent body 10. Therefore, even when the ceramic fluorescent body 10 and the molten solder 40, which becomes the solder layer 30, shrink due to the temperature falling, the ceramic fluorescent body 10 is not restrained by the protruding portion 32.

Next, the details of an evaluation test for describing the effect of the wavelength conversion member 1 of the present embodiment and the results of the evaluation test will be described. In the present evaluation test, two evaluation tests which will be described below were carried out.

In a first evaluation test, the void fractions of various portions of the solder layer 30 were measured and were compared. In the first evaluation test, first, an image of a target portion whose void fraction was to be measured was captured through irradiation of the solder layer 30 with a transmissive x-ray. Subsequently, voids having a diameter of 10 micrometers or greater were counted on the captured image, and the void fraction of the target portion was calculated. Notably, the void fraction calculated here is the void fraction calculated by the method having been described with reference to FIG. 3.

FIG. 5 is a pair of views used for describing the details of the first evaluation test for the wavelength conversion member 1. Section (a) of FIG. 5 is a top view of the wavelength conversion member 1 used in the first evaluation test, and section (b) of FIG. 5 is a cross-sectional view taken along line A-A in section (a) of FIG. 5. In the first evaluation test, for the wavelength conversion member 1 having a rectangular ceramic fluorescent body 10, the void fraction of the joining portion 31, the void fraction of the central portion 31a contained in the joining portion 31, and the void fraction of the protruding portion 32 were calculated. In the first evaluation test, the diameter W1 of a circular cross section of the circular columnar central portion 31*a* is prescribed to be half of the narrowest width W2 of the ceramic fluorescent body 10. Specifically, the diameter W1 of the central portion 31*a* is set to 4 mm, and the width W2 of the ceramic fluorescent body 10 is set to 8 mm. Also, in section (b) of FIG. 5, the width W3 of the solder layer 30 is 9 mm. Namely, the total of the widths of portions of the protruding portion 32 protruding from the ceramic fluorescent body 10 on opposite sides is 1 mm.

Also, in the wavelength conversion member 1 shown in FIG. 5, the thickness Th1 of the joining portion 31 is 10 micrometers, and the thickness Th2 of the protruding portion 32 is 17 micrometers. Therefore, the first evaluation test was performed by using the wavelength conversion member 1 in which the ratio of the thickness Th2 of the protruding portion 32 to the thickness Th1 of the joining portion 31 is 1.7.

FIG. 6 includes a table and a view used for describing the results of the first evaluation test for the wavelength conversion member 1. Section (a) of FIG. 6 is a table showing the results of measurement of the void fractions in the first evaluation test, and section (b) of FIG. 6 is a view schematically showing the distribution of voids V1 in the wavelength conversion member 1. The first evaluation test revealed that the void fraction (3.4%) of the joining portion 31 including the central portion 31*a* is lower than the void fraction (4.3%) of the protruding portion 32. This shows that, since the voids between the ceramic fluorescent body 10 and the heat radiation member 20 move to the outside of the ceramic fluorescent body 10 when the ceramic fluorescent body 10 and the heat radiation member 20 are joined together, whereas the number of the voids V1 of the protruding portion 32 increases, the number of the voids V1 of the joining portion 31 decreases (see section (b) of FIG. 6).

Also, the first evaluation test revealed that the void fraction (2.8%) of the central portion 31*a* of the joining portion 31 is lower than the void fraction (3.4%) of the entire joining portion 31. Namely, it become clear that the void fraction of the central portion 31*a* is lower than the void fraction of the remaining portion 31*b* of the joining portion 31 remaining after exclusion of the central portion 31*a* therefrom. As a result, the thermal conductivity of the central portion 31*a*, which is located between the heat radiation member 20 and the central portion C10 of the ceramic fluorescent body 10 that generates a large amount of heat because of easy irradiation with light, is higher than the thermal conductivity of the remaining portion of the joining portion 31 remaining after exclusion of the central portion 31*a*.

FIG. 7 includes a table and views used for describing the results of a second evaluation test for the wavelength conversion member 1. In the second evaluation test, the void fraction of the joining portion 31 was measured when the ratio of the thickness of the the protruding portion 32 to the thickness of the joining portion 31 was set to 1, 1.2, 1.5, 2, 5.3, and 10 as shown in the table of section (a) of FIG. 7, and the measured values of the void fraction were compared. Sections (b) and (c) of FIG. 7 are views schematically showing the distribution of voids V1 of the joining portion 31 and the distribution of voids V1 of the protruding portion 32 for the case where the ratio of the thickness of the protruding portion 32 to the thickness of the joining portion 31 was changed. Notably, the void fractions in the second evaluation test are the same as the void fractions calculated by the method described in relation to the first evaluation test.

As shown in section (a) of FIG. 7, it became clear that, when the ratio of the thickness of the protruding portion 32 to the thickness of the joining portion 31 increases, the void fraction of the joining portion 31 becomes smaller. Namely, the test results show that, in the case where the thickness of the joining portion 31 is the same, the number of the voids V1 contained in the joining portion 31 of the wavelength conversion member 1 which is large in thickness ratio (section (c) of FIG. 7) is smaller than the number of the voids V1 contained in the joining portion 31 of the wavelength conversion member 1 which is small in thickness ratio (section (b) of FIG. 7). In particular, it became clear that, as shown in section (a) of FIG. 7, when the ratio of the thickness of the protruding portion 32 to the thickness of the joining portion 31 is made two times or more, the void fraction of the joining portion 31 becomes very small as compared with the case where the ratio is less than two times.

According to the above-described wavelength conversion member 1 of the present embodiment, in the solder layer 30, the maximum value of the protruding portion 32 is greater than the average value of the thickness of the joining portion 31. When the ceramic fluorescent body 10 and the heat radiation member 20 are joined together, the protruding portion 32 is formed as a result of the solder between the ceramic fluorescent body 10 and the heat radiation member 20 being pushed out toward the outside of the outer circumferential portion 13 of the ceramic fluorescent body 10. At that time, the voids V1 present in the solder between the ceramic fluorescent body 10 and the heat radiation member 20 move from a region between the ceramic fluorescent body 10 and the heat radiation member 20 together with the pushed out solder, and move upward in the molten solder 40 on the outer side of the outer circumferential portion 13 of the ceramic fluorescent body 10. As a result, the number of the voids V1 of the joining portion 31 decreases as compared with the case where the voids do not move. Therefore, the heat conduction between the ceramic fluorescent body 10 and the heat radiation member 20 becomes less likely to be hindered by the voids V1. Accordingly, the thermal conductivity between the ceramic fluorescent body 10 and the heat radiation member 20 can be improved. Also, according to the wavelength conversion member 1 of the present embodiment, the protruding portion 32 is spaced apart from the side surface 14 of the ceramic fluorescent body 10. Therefore, even in the case where the solder layer 30 shrinks when the temperature falls after the ceramic fluorescent body 10 and the heat radiation member 20 have been joined together, the protruding portion 32 does not restrain the ceramic fluorescent body 10. As a result, it is possible to prevent breakage of the ceramic fluorescent body 10 due to shrinkage of the solder layer 30. As described above, it is possible to simultaneously achieve improvement of the thermal conductivity between the ceramic fluorescent body 10 and the heat radiation member 20 and prevention of breakage of the ceramic fluorescent body 10. Also, since the thermal conductivity between the ceramic fluorescent body 10 and the heat radiation member 20 is improved, the durability of the ceramic fluorescent body 10 is improved, and a decrease in light emission efficiency can be suppressed.

Also, according to the wavelength conversion member 1 of the present embodiment, the void fraction of the joining portion 31 is lower than the void fraction of the protruding portion 32. Therefore, the heat conduction between the ceramic fluorescent body 10 and the heat radiation member 20 by the joining portion 31 is less likely to be hindered by the voids V1. Accordingly, the thermal conductivity between the ceramic fluorescent body 10 and the heat radiation member 20 can be improved.

Also, according to the wavelength conversion member 1 of the present embodiment, in the joining portion 31, the void fraction of the central portion 31a located between the central portion C10 of the ceramic fluorescent body 10 and the heat radiation member 20 is lower than the void fraction of the remaining portion 31b of the joining portion 31. The central portion 31a of the joining portion 31 is located between the heat radiation member 20 and the central portion C10 of the ceramic fluorescent body 10 that generates a large amount of heat because of easy irradiation with light. Since the central portion 31a of the joining portion 31 is higher in thermal conductivity than the remaining portion of the joining portion 31, the heat generated in the central portion C10 of the ceramic fluorescent body 10 as a result of irradiation with light can be quickly transferred to the heat radiation member 20. Accordingly, the thermal conductivity between the ceramic fluorescent body 10 and the heat radiation member 20 can be improved by rendering the void fraction of the central portion 31a lower than the void fraction of the remaining portion 31b of the joining portion 31.

Also, according to the wavelength conversion member 1 of the present embodiment, the protruding portion 32 is formed to surround the entire circumference of the outer circumferential portion 13 of the ceramic fluorescent body 10. Therefore, when the ceramic fluorescent body 10 and the heat radiation member 20 are joined together, the solder of the central portion S41 of the solder layer 30 protrudes along the entire circumference of the outer circumferential portion 13 of the ceramic fluorescent body 10. Since the distance over which the voids V1 of the central portion S41 move to the outer portion S42 becomes shorter as compared with the case where the protruding portion 32 is formed to surround a portion of the outer circumferential portion 13 of the ceramic fluorescent body 10, the number of the voids V1 of the joining portion 31 decreases further. Accordingly, the thermal conductivity between the ceramic fluorescent body 10 and the heat radiation member 20 can be further improved.

Also, according to the wavelength conversion member 1 of the present embodiment, the height H1 (the maximum value of thickness) of the protruding portion 32 is not less than two times the average value of the thickness of the joining portion 31 and not greater than ten times the average value. As a result, it becomes easier for the voids V1 moving from the region between the ceramic fluorescent body 10 and the heat radiation member 20 to the outside of the outer circumferential portion 13 of the ceramic fluorescent body 10 to move upward in the solder layer 30 on the outer side of the outer circumferential portion 13 of the ceramic fluorescent body 10. Therefore, movement of the voids V1 of the central portion S41 to the outer portion S42 becomes easier, and the number of the voids V1 of the joining portion 31 decreases further. Accordingly, the thermal conductivity between the ceramic fluorescent body 10 and the heat radiation member 20 can be further improved.

Also, according to the wavelength conversion member 1 of the present embodiment, the height H1 of the protruding portion 32 from the heat radiation member 20 is less than the height H2 of the light incident surface 11 of the ceramic fluorescent body 10 from the heat radiation member 20. Therefore, it is possible to prevent hindrance of light emission from the ceramic fluorescent body 10 by the protruding portion 32, whose maximum thickness is greater than the average thickness of the joining portion 31.

Also, according to the light source device 5 of the present embodiment, the light source device 5 emits to the outside the light L2 whose wavelength differs from the wavelength of the light L1 which is applied to the ceramic fluorescent body 10 by the light source 6. In the wavelength conversion member 1 having the ceramic fluorescent body 10 for converting the wavelength of the light L1, since the number of the voids V1 contained in the joining portion 31 of the solder layer 30 between the ceramic fluorescent body 10 and the heat radiation member 20 is relatively small, the heat conduction in the joining portion 31 between the ceramic fluorescent body 10 and the heat radiation member 20 is less likely to be hindered by the voids V1. Therefore, a decrease in the light emission intensity of the light source device 5 due to temperature quenching can be suppressed. Also, since the protruding portion 32 is spaced apart from the side surface 14 of the ceramic fluorescent body 10, it is possible to prevent the ceramic fluorescent body 10 from being broken due to shrinkage of the solder layer 30. Therefore, it is possible to prevent a decrease in the light emission intensity of the light source device 5 due to breakage of the ceramic fluorescent body 10.

MODIFICATIONS OF THE PRESENT EMBODIMENT

The present invention is not limited to the above-described embodiment and can be practiced in various forms without departing from the gist of the invention, and, for example, the following modifications are possible.

Modification 1

In the solder layer 30 of the above-described embodiment, the void fraction of the protruding portion 32, which is spaced apart from the side surface 14 of the ceramic fluorescent body 10 and whose maximum thickness is greater than the average thickness of the joining portion 31, is higher than the the void fraction of the joining portion 31, and the void fraction of the central portion 31a is lower than the void fraction of the remaining portion 31b. However, the shape of the solder layer 30 and the feature of the void fraction are not limited thereto. However, the solder layer 30 may be formed such that, although the void fraction of the protruding portion 32, which is spaced apart from the side surface 14 of the ceramic fluorescent body 10 and whose maximum thickness is greater than the average thickness of the joining portion 31, is higher than the void fraction of the joining portion 31, the void fraction of the central portion 31a is higher than the void fraction of the remaining portion 31b.

Modification 2

Also, in the solder layer 30, only the condition of the void fraction of the protruding portion 32 being higher than the void fraction of the joining portion 31 may be satisfied, the maximum value of the thickness of the protruding portion 32 may be approximately equal or smaller than the average value of the thickness of the joining portion 31, and the void fraction of the central portion 31a may be higher than the void fraction of the remaining portion 31b.

FIG. 8 is a pair of sectional views of a modification of the wavelength conversion member 1 of the first embodiment.

The modification of the wavelength conversion member 1 shown in FIG. 8 is achieved by machining, in a machining step, the protruding portion 32 in the wavelength conversion member 1 shown in section (a) of FIG. 8 and manufactured by the manufacturing method having been described in the first embodiment. Specifically, as shown in section (b) of FIG. 8, a portion 32a of the protruding portion 32 which forms an inner wall 33 is removed, for example, in such a manner that the thickness of a remaining portion 32b of the protruding portion 32 becomes approximately equal to the thickness of the joining portion 31. Even in the case where the wavelength conversion member 1 has a shape as shown in section (b) of FIG. 8, the void fraction of the joining portion 31 is lower than the void fraction of the protruding portion 32 because the voids V1 have moved to the outside of the ceramic fluorescent body 10 upon joining of the ceramic fluorescent body 10 and the heat radiation member 20. Therefore, even in the wavelength conversion member 1 in the state shown in FIG. 8, the heat conduction between the ceramic fluorescent body 10 and the heat radiation member 20 becomes less likely to be hindered by the voids V1, and thus, the thermal conductivity between the ceramic fluorescent body 10 and the heat radiation member 20 can be improved. Notably, the part of the protruding portion 32 removed in the machining step is only required to include the portion 32a forming the inner wall 33 which is spaced apart from the side surface 14 of the ceramic fluorescent body 10, and the thickness of the remaining portion 32b after the machining may be smaller than the thickness of the joining portion 31.

Modification 3

Also, in the solder layer 30, only the condition of the void fraction of the central portion 31a being lower than the void fraction of the remaining portion 31b may be satisfied, the maximum value of the thickness of the protruding portion 32 may be smaller than the average value of the thickness of the joining portion 31, and the void fraction of the protruding portion 32 may be lower than the void fraction of the joining portion 31.

Modification 4

In the above-described embodiment, the protruding portion 32 is formed to surround the entire circumference of the outer circumferential portion 13 of the ceramic fluorescent body 10. However, the protruding portion 32 may be formed to be located adjacent to a portion of the outer circumferential portion 13 of the ceramic fluorescent body 10.

FIG. 9 is a top view of another modification of the wavelength conversion member 1 of the first embodiment. As shown in FIG. 9, the protruding portion 32 may be formed to have, for example, a C-like shape so as to surround a portion of the outer circumferential portion 13 of the ceramic fluorescent body 10. Specifically, the protruding portion 32 may be formed to surround the outer circumferential portion 13 which forms, for example, three of four side surfaces 14a, 14b, 14c, and 14d of the rectangular ceramic fluorescent body 10; i.e., the side surfaces 14b, 14c, and 14d. Even in such a case, when the ceramic fluorescent body 10 and the heat radiation member 20 are joined together, the voids between the ceramic fluorescent body 10 and the heat radiation member 20 move to the outside of the ceramic fluorescent body 10. Therefore, the thermal conductivity between the ceramic fluorescent body 10 and the heat radiation member 20 can be improved.

Modification 5

In the above-described embodiment, the maximum value of thickness of the protruding portion 32 is not less than two times the average value of the thickness of the joining portion 31 and not greater than ten times the average value. However, the relation between the maximum value of thickness of the protruding portion 32 and the average value of the thickness of the joining portion 31 is not limited thereto. Even in the case where the maximum value of thickness of the protruding portion 32 is less than two times the average value of the thickness of the joining portion 31, the thermal conductivity between the ceramic fluorescent body 10 and the heat radiation member 20 can be improved, because the voids V1 of the central portion S41 of the solder layer 30 move to the outer portion S42.

Modification 6

In the above-described embodiment, the height H1 of the apex 34 of the protruding portion 32 from the heat radiation member 20 is rendered less than the height H2 of the ceramic fluorescent body 10 from the heat radiation member 20. However, the relation between the height H1 of the protruding portion 32 and the height H2 of the ceramic fluorescent body 10 is not limited thereto.

Modification 7

In the above-described embodiment, the voids V1 originate from the gap between the gold tin solder foil F1 and the metal film or the joint film and from gas mixed in the plating step. However, the cause of generation of the voids V1 is not limited thereto, and, in the case where a gold tin paste is used, the voids V1 may originate from a binder contained in the gold tin paste.

Although the present aspects has been described on the basis of embodiments and modifications, the above-described embodiments of the aspects is provided so as to facilitate the understanding of the present aspects and does not limit the present aspect. The present aspects can be changed or improved without departing from the purpose of the aspects and the claims, and encompasses equivalents thereof. Also, the technical feature(s) may be eliminated as appropriate unless the present specification mentions that the technical feature(s) is mandatory.

DESCRIPTION OF SYMBOLS

1: wavelength conversion member
5: light source device
6: light source
10: ceramic fluorescent body
11: incident surface
12: main surface
13: outer circumferential portion
14, 14a, 14b, 14c, 14d: side surface
20: heat radiation member
21: main surface
30: solder layer
31: joining portion
31a: central portion
31b: remaining portion
32: protruding portion 32a: separated portion
32b: remaining portion
33: inner wall
34: apex
40: molten solder
C10: central portion of ceramic fluorescent body
F1: gold tin solder foil
L1, L2: light
S41: central portion
S42: outer portion
S43: inner wall
V1: void

What is claimed is:

1. A wavelength conversion member comprising:
a ceramic fluorescent body for converting a wavelength of incident light;
a heat radiation member for radiating heat of the ceramic fluorescent body to an outside atmosphere; and
a solder layer for joining together the ceramic fluorescent body and the heat radiation member,
wherein the solder layer includes a joining portion disposed between the ceramic fluorescent body and the heat radiation member and a protruding portion protruding outward from an outer circumferential portion of the ceramic fluorescent body,
the protruding portion is spaced apart from a side surface formed on the outer circumferential portion of the ceramic fluorescent body, and
in the solder layer, a maximum value of thickness of the protruding portion is greater than an average value of thickness of the joining portion.

2. The wavelength conversion member according to claim 1, wherein the protruding portion is formed to surround the entire circumference of the outer circumferential portion of the ceramic fluorescent body.

3. The wavelength conversion member according to claim 1, wherein a maximum value of thickness of the protruding portion is not less than two times an average value of thickness of the joining portion and not greater than ten times the average value.

4. The wavelength conversion member according to claim 1, wherein a height of the protruding portion from the heat radiation member is less than a height of a light incident surface of the ceramic fluorescent body from the heat radiation member.

5. A light source device comprising:
the wavelength conversion member according to claim 1; and
a light source for applying light to the ceramic fluorescent body.

6. The wavelength conversion member according to claim 2, wherein a maximum value of thickness of the protruding portion is not less than two times an average value of thickness of the joining portion and not greater than ten times the average value.

7. The wavelength conversion member according to claim 6, wherein a height of the protruding portion from the heat radiation member is less than a height of a light incident surface of the ceramic fluorescent body from the heat radiation member.

8. A wavelength conversion member comprising:
a ceramic fluorescent body for converting a wavelength of incident light;
a heat radiation member for radiating heat of the ceramic fluorescent body to an outside atmosphere; and
a solder layer for joining together the ceramic fluorescent body and the heat radiation member,
wherein the solder layer includes a joining portion disposed between the ceramic fluorescent body and the heat radiation member and a protruding portion protruding outward from an outer circumferential portion of the ceramic fluorescent body, and
a void fraction of the joining portion is lower than a void fraction of the protruding portion.

9. The wavelength conversion member according to claim 8, wherein the protruding portion is formed to surround the entire circumference of the outer circumferential portion of the ceramic fluorescent body.

10. The wavelength conversion member according to claim 8, wherein a maximum value of thickness of the protruding portion is not less than two times an average value of thickness of the joining portion and not greater than ten times the average value.

11. The wavelength conversion member according to claim 8, wherein a height of the protruding portion from the heat radiation member is less than a height of a light incident surface of the ceramic fluorescent body from the heat radiation member.

12. A light source device comprising:
the wavelength conversion member according to claim 8; and
a light source for applying light to the ceramic fluorescent body.

13. The wavelength conversion member according to claim 9, wherein a maximum value of thickness of the protruding portion is not less than two times an average value of thickness of the joining portion and not greater than ten times the average value.

14. A wavelength conversion member comprising:
a ceramic fluorescent body for converting a wavelength of incident light;
a heat radiation member for radiating heat of the ceramic fluorescent body to an outside atmosphere; and
a solder layer for joining together the ceramic fluorescent body and the heat radiation member,
wherein the solder layer includes a joining portion disposed between the ceramic fluorescent body and the heat radiation member and a protruding portion protruding outward from an outer circumferential portion of the ceramic fluorescent body, and
in the joining portion, a void fraction of a central portion through which a center axis of the wavelength conversion member extends is lower than a void fraction of a remaining portion of the joining portion remaining after exclusion of the central portion.

15. The wavelength conversion member according to claim 14, wherein the protruding portion is formed to surround the entire circumference of the outer circumferential portion of the ceramic fluorescent body.

16. The wavelength conversion member according to claim 14, wherein a maximum value of thickness of the protruding portion is not less than two times an average value of thickness of the joining portion and not greater than ten times the average value.

17. The wavelength conversion member according to claim 14, wherein a height of the protruding portion from the heat radiation member is less than a height of a light incident surface of the ceramic fluorescent body from the heat radiation member.

18. A light source device comprising:
the wavelength conversion member according to claim 14; and
a light source for applying light to the ceramic fluorescent body.

19. The wavelength conversion member according to claim 15, wherein a maximum value of thickness of the protruding portion is not less than two times an average value of thickness of the joining portion and not greater than ten times the average value.

* * * * *